United States Patent
Chen et al.

(10) Patent No.: US 10,733,333 B2
(45) Date of Patent: Aug. 4, 2020

(54) BUILDING DATA CONSOLIDATION METHODS AND SYSTEMS

(71) Applicant: Honeywell International Inc., Morris Plains, NJ (US)

(72) Inventors: Henry Chen, Beijing (CN); Jian Geng Du, Beijing (CN); Yan Xia, Beijing (CN); Tom Plocher, Hugo, MN (US); Liana M. Kiff, Minneapolis, MN (US); Michelle Raymond, Minneapolis, MN (US)

(73) Assignee: Honeywell International Inc., Morris Plains, NJ (US)

( * ) Notice: Subject to any disclaimer, the term of this patent is extended or adjusted under 35 U.S.C. 154(b) by 611 days.

(21) Appl. No.: 15/416,723

(22) Filed: Jan. 26, 2017

(65) Prior Publication Data

US 2017/0147717 A1    May 25, 2017

Related U.S. Application Data

(63) Continuation of application No. PCT/CN2014/084693, filed on Aug. 19, 2014.

(51) Int. Cl.
G06F 30/13    (2020.01)

(52) U.S. Cl.
CPC ................. G06F 30/13 (2020.01)

(58) Field of Classification Search
None
See application file for complete search history.

(56) References Cited

U.S. PATENT DOCUMENTS

| 2009/0160856 A1* | 6/2009 | Hoguet | G06Q 10/06 345/420 |
| 2009/0187839 A1 | 7/2009 | Omiya | |
| 2009/0276070 A1 | 11/2009 | Burkes et al. | |
| 2010/0198563 A1* | 8/2010 | Plewe | G06F 17/5004 703/1 |
| 2011/0209081 A1* | 8/2011 | Chen | G06F 17/50 715/771 |

(Continued)

FOREIGN PATENT DOCUMENTS

CN    102693333 A    9/2012

OTHER PUBLICATIONS

Dong, Bing et al. "A BIM-Enabled Information Infrastructure for Building Energy Fault Detection and Diagnosis", May 10, 2014, Automation in Construction 44, Elsevier B.V. (Year: 2014).*

(Continued)

*Primary Examiner* — Cedric Johnson
(74) *Attorney, Agent, or Firm* — Seager, Tufte & Wickhem, LLP

(57) ABSTRACT

Devices, methods, systems, and computer-readable media for building data consolidation are described herein. One or more embodiments include a method for building data consolidation, comprising: receiving a plurality of representative drawings that comprise a portion of a building, determining a boundary and a location of each of the plurality of representative drawings, wherein the boundary and the location correspond to the building, and stitching the plurality of representative drawings into a combined representative drawing of the building based on the boundary and the location.

19 Claims, 8 Drawing Sheets

(56) References Cited

U.S. PATENT DOCUMENTS

| | | | |
|---|---|---|---|
| 2011/0218777 A1* | 9/2011 | Chen | G06F 17/50 |
| | | | 703/1 |
| 2011/0270584 A1* | 11/2011 | Plocher | G06F 17/5004 |
| | | | 703/1 |
| 2013/0013265 A1 | 1/2013 | Narayan et al. | |
| 2013/0257850 A1 | 10/2013 | Chen et al. | |

OTHER PUBLICATIONS

Becerik-Gerber, Burcin et al., "Application Areas and Data Requirements for BIM-Enabled Facilities Management", Mar. 1, 2012, Journal of Construction Engineering and Management, ASCE. (Year: 2012).*

Teran, Jose et al., "Building Information Modeling (BIM) Approach to the GMT Project", Jul. 22, 2014, SPIE Astronomical Telecopes + Instrumentation, SPIE. (Year: 2014).*

Lin, Ya-Hong et al. "The IFC Based Planning for 3D Indoor Spaces", Nov. 21, 2019, Advanced Engineering Informatics, 27, Elsevier Ltd. (Year: 2012).*

Yin, Xuetao et al. "Generating 3D Building Models from Architectural Drawings: A Survey", Jan./Feb. 2009, Arizona State University, IEEE Computer Society. (Year: 2009).*

Ibraham, Magdy M. et al. "A Web-Based Approach to Transferring Architectural Information to the Construction Site Based on the BIM Object Concept", 2004, CAADRIA. (Year: 2004).*

Duddy, Keith et al., "Q: Why is a Raven like a Writing Desk? A: They're Both Objects", Oct. 1, 2012, Proceedings of the Modeling of the Physical World Workshop. (Year: 2012).*

International Search Report from related PCT Application PCT/CN2014/084693 dated May 21, 2015, 3 pp.

* cited by examiner

BUILDING DATA CONSOLIDATION METHODS AND SYSTEMS

CROSS REFERENCE TO RELATED APPLICATION

This application claims priority to PCT Application No. PCT/CN2014/084693, filed Aug. 19, 2014, which is incorporated herein by reference in its entirety.

TECHNICAL FIELD

The present disclosure relates to methods, devices, system, and computer-readable media for building data consolidation.

BACKGROUND

Building information modeling (BIM) can refer to the generation and/or management of data associated with a building (e.g., data associated with the components, equipment, and/or properties of a building). For example, BIM data can include architectural, mechanical, electrical, plumbing, sanitary, fire, and/or geometrical information associated with a building.

The leading international standard for describing the data contained within a building information model is called the Industry Foundation Classes (IFC), which is an open standard designed and maintained by the Building Smart Alliance. This is a very comprehensive standard that provides for the description of data related to many sub-domains related to the design, build, construction, and/or operation of a built environment (e.g., building).

The amount of BIM data associated with a building, and codified or expressed in the IFC standard, tends to be proportional to the size of the building, and can grow exponentially based on the number of specific sub-domains that are identified and documented in the BIM, including, for example, plumbing, electrical, or HVAC systems. Therefore, even a small building with very complete information for many different systems within the building may have a very large amount of BIM data associated therewith.

BIM data can be very useful information for a building manager, building contractor, building maintenance, among other service providers for a building. Many buildings do not currently have BIM data associated with the building. Buildings that do not have BIM data associated with them can have limitations when it comes to navigation, maintenance, and troubleshooting products.

DETAILED DESCRIPTION

Figure 1:
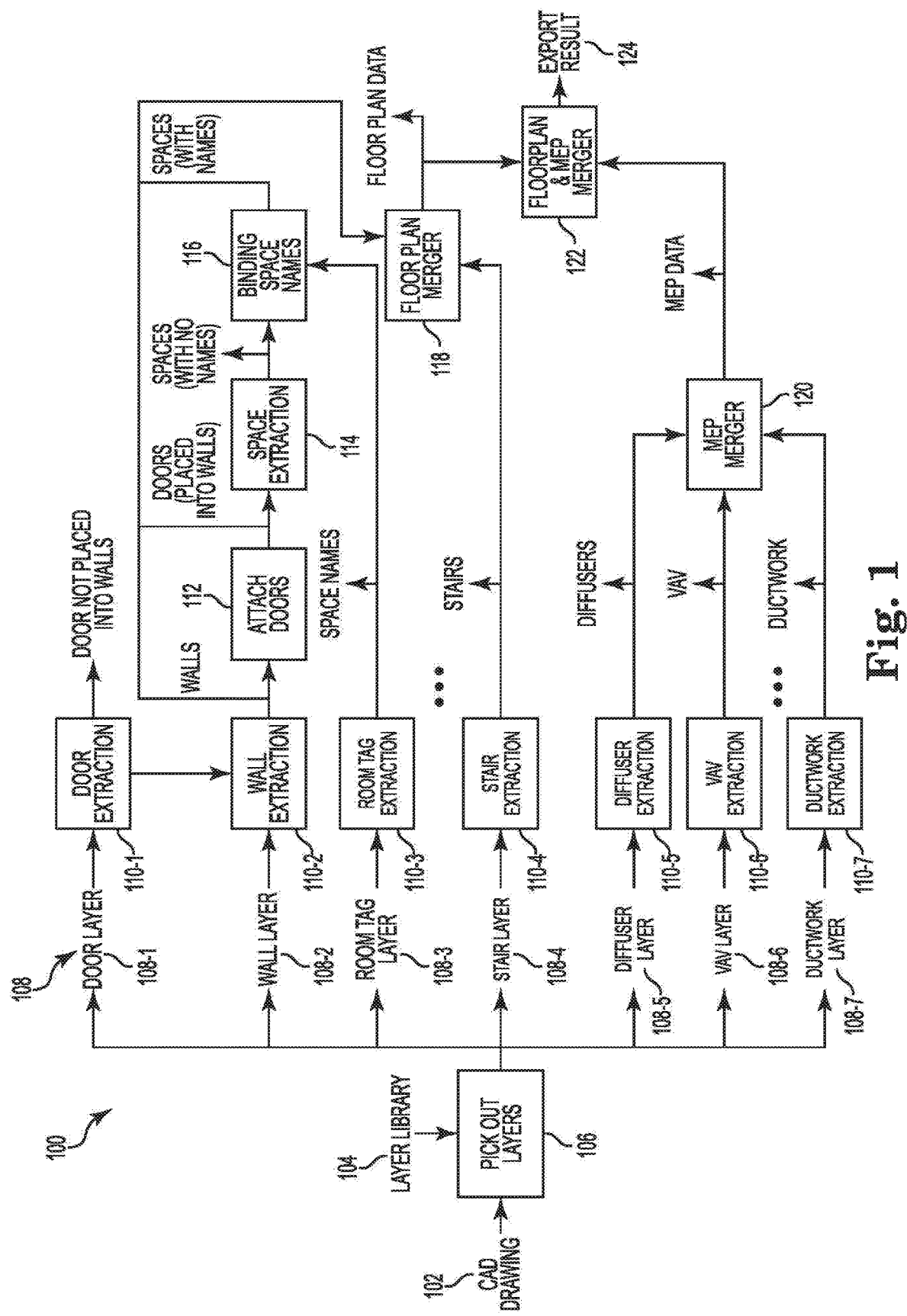
FIG. 1 is an example of a method for building data consolidation according to one or more embodiments of the present disclosure.

Devices, methods, systems, and computer-readable media for building data consolidation are described herein. For example, one or more embodiments can include a method for building data consolidation, comprising: receiving a plurality of representative drawings that comprise a portion of a building, determining a boundary and a location of each of the plurality of representative drawings, wherein the boundary and the location correspond to the building, and stitching the plurality of representative drawings into a combined representative drawing of the building based on the boundary and the location.

The devices, methods, systems, and computer-readable media for building data consolidation can include extracting data from computer-aided drawings (CAD drawings) (e.g., CAD representations, etc.). Features of the CAD drawings can be extracted into a number of layers (e.g., categories). Each of the number of layers can include information relating to features of the CAD drawings that relate to the corresponding layer. For example, a door layer can include information from the CAD drawings that corresponds to doors within the CAD drawings. In this example, the information from the CAD drawings can include a location within a building where a particular door is located. In addition, the information from the CAD drawings can include additional information relating to a door type.

The devices, methods, systems, and computer-readable media for building data consolidation can also include stitching a number of zones of a building into a complete representation of a building. Stitching the number of zones into a complete representation can include generating and/or receiving a number of primitives that represent a particular zone (e.g., area) of a building. The number of primitives can be analyzed to determine a location of each of the primitives and the number of primitives can be stitched together based on the determined location.

In addition, building data consolidation can include extracting floor plans, mechanical, electrical, and plumbing (MEP) plans, and/or schedule plans and fusing the information extracted from the plans into construction operations building information exchange (CoBie) data. In some embodiments, building data consolidation can include extracting data from the CAD drawings to produce a number of primitives of the building, stitching the number of primitives at determined locations to generate a complete representation of the building, and generating a CoBie table based on the extracted information from the CAD drawings and complete representation.

In the following detailed description, reference is made to the accompanying drawings that form a part hereof. The drawings show by way of illustration how one or more embodiments of the disclosure may be practiced.

These embodiments are described in sufficient detail to enable those of ordinary skill in the art to practice one or more embodiments of this disclosure. It is to be understood that other embodiments may be utilized and that process changes may be made without departing from the scope of the present disclosure.

As will be appreciated, elements shown in the various embodiments herein can be added, exchanged, combined, and/or eliminated so as to provide a number of additional embodiments of the present disclosure. The proportion and the relative scale of the elements provided in the figures are intended to illustrate the embodiments of the present disclosure, and should not be taken in a limiting sense.

The figures herein follow a numbering convention in which the first digit or digits correspond to the drawing figure number and the remaining digits identify an element or component in the drawing. Similar elements or components between different figures may be identified by the use of similar digits.

As used herein, "a" or "a number of" something can refer to one or more such things. For example, "a number of security levels" can refer to one or more security levels. Additionally, the designator "N", as used herein, particularly with respect to reference numerals in the drawings, indicates that a number of the particular feature so designated can be included with a number of embodiments of the present disclosure.

FIG. 1 is an example of a method 100 for building data consolidation according to one or more embodiments of the present disclosure. The method 100 can be utilized to extract data from a number of CAD drawings 102 of a building to generate a building information modeling (BIM) model of the building.

The method 100 can include a number of CAD drawings 102. The number of CAD drawings 102 can be CAD representations of a building. The CAD drawings 102 can include a number of features of the building. For example, the number of features of the building can include, but are not limited to: doors, walls, rooms, stairs, elevators, heating, ventilation, air conditioning (HVAC) components, electrical equipment, plumbing equipment, among other features of a building.

The method 100 can include a layer library 104. The layer library 104 can include a number of rules for extracting the number of layers 108 from the CAD drawings 102. In some embodiments, the layer library 104 can include a number of filters to extract the number of layers 108 from the CAD drawings 102. The number of filters in the layer library 104 can enable extraction of only objects within a particular layer 108 (e.g., doors, spaces, HVAC objects, etc.). The filters can be utilized to extract objects from the CAD drawings 102 based on a layer naming convention that is designated by the CAD drawings 102. The filters can also include features to "turn on", "turn off", "freeze", and/or "thaw" in order to extract specific data from specific layers of the CAD drawings 102. The features of the filters can be enabled and/or disabled to reduce noise from the extracted data.

The method 100 can include selecting layers 106 (e.g., picking out layers). Selecting layers 106 can include a selection menu that is displayed to a user (e.g., human user, computing device, etc.). The selection menu can include each of the number of layers 108 and enable the user to select one or more of the layers 108. Selection of one or more of the layers 108 can provide a display of the selected one or more layers 108.

The number of layers 108 can be separated based on the rules and/or filters in the layer library 104. The number of layers 108 can be separated into a door layer 108-1, a wall layer 108-2, a room tag layer 108-3, a stair layer 108-4, a diffuser layer 108-5, a variable air volume (VAV) layer 108-6, and/or a ductwork layer 108-7, among various other layers 108. Each layer 108 of the CAD drawings 102 can be extracted to obtain additional information relating to each layer 108. For example, the door layer 108-1 can be extracted at 110-1, the wall layer 108-2 can be extracted at 110-2, the room tag layer 108-3 can be extracted at 110-3, the stair layer 108-4 can be extracted at 110-4, the diffuser layer 108-5 can be extracted at 110-5, the VAV layer 108-6 can be extracted at 110-6, and the ductwork layer 108-7 can be extracted at 110-7.

The number of layers 108 can be separated into a number of categories. For example, the door layer 108-1, the wall layer 108-2, the room tag layer 108-3, and the stair layer 108-4 can be categorized as part of a floor plan category. In another example, the diffuser layer 108-5, the VAV layer 108-6, and the ductwork layer 108-7 can be categorized as part of a MEP category. The number of layers 108 can be separated into a number of categories so that extracted data from each of the number of categories can be merged into a BIM model. In some embodiments, the extracted data from each of the number of categories is merged and then each of the categories can be subsequently merged as described herein. Primitive data from each layer 108 can be removed in order to remove noise from the extracted data of each layer individually. Primitive data can include, but is not limited to: lines, polygons, polylines, rectangles, circles, ellipses, splines, arcs, text, and/or other shapes and symbols to represent various objects within the building.

The method 100 shows the floor plan category being merged. In some embodiments the floor plan category can begin by merging the extracted doors from 110-1 with the extracted walls 110-2 via attaching doors 112. When the extracted doors 110-1 are merged with the extracted walls 110-2, space data can be extracted via space extraction 114. The space data can be extracted to identify rooms, hallways, spaces for stairs, among other spaces within the building described in the CAD drawing 102. The extracted space data can include a number of spaces with no names (e.g., hallways, lobby, seating areas, etc.). The extracted space data can also include spaces with room names that were extracted via room tag extraction 110-4. The extracted room names can be merged with the extracted space data via binding space names 116. Other extracted data including the extracted stair data via stair extraction 110-4 can be merged via a floor plan merger 118. The other extracted data can include merging other layers that were extracted from the CAD drawing 102.

The method 100 shows the extracted MEP data merged via MEP merger 120. The MEP data can include merging the extracted diffuser data extracted via diffuser extraction 110-5, the extracted VAV data extracted via VAV extraction 110-6, and/or the extracted ductwork data extracted via ductwork extraction 110-7.

The method 100 can also include merging the number of categories. The method 100 shows that the merged floor plan data that is merged at floor plan merger 118 and the merged MEP data is merged at MEP merger 120 via floor plan and MEP merger 122. The resulting floor plan and MEP data can be exported to a computing device via 124.

The MEP merger 122 can include binding extracted object names from the CAD drawings 102 to each corresponding object within the MEP data. In addition, the floor plan merger 118 can include binding extracted object names from the CAD drawings 102 to each corresponding object within the floor plan data.

The method 100 can be utilized to extract a plurality of layers 108 (e.g., door layer 108-1, wall layer 108-2, room tag layer 108-3, stair layer 108-4, diffuser layer 108-5, VAV layer 108-6, ductwork layer 108-7, etc.) and merge the extracted layers 108 into a BIM model by merging each layer 108 individually. As described herein, the plurality of layers 108 can be separated into a number of categories (e.g., floor plan category, MEP category, etc.). Each of the number of categories can be merged separately. That is, the extracted data from the floor plan category can be merged into the BIM model separately from the extracted data from the MEP category. As described herein, the floor plan category and the MEP category can be merged together into a BIM model to generate a complete BIM model of the building represented by the CAD drawings 102.

The method 100 can include a relatively higher accuracy of identifying objects, spaces, walls, etc. from the CAD drawings 102 by extracting a single object type and/or single layer type from multiple layers of the CAD drawings 102. Extracting a single object type and/or single layer type from the CAD drawings 102 can reduce the noise that may be generated from extracting multiple object types and/or multiple layer types at the same time. In addition, by removing the primitives of each layer from the extracted data can also remove noise from the extracted data.

Figure 2:
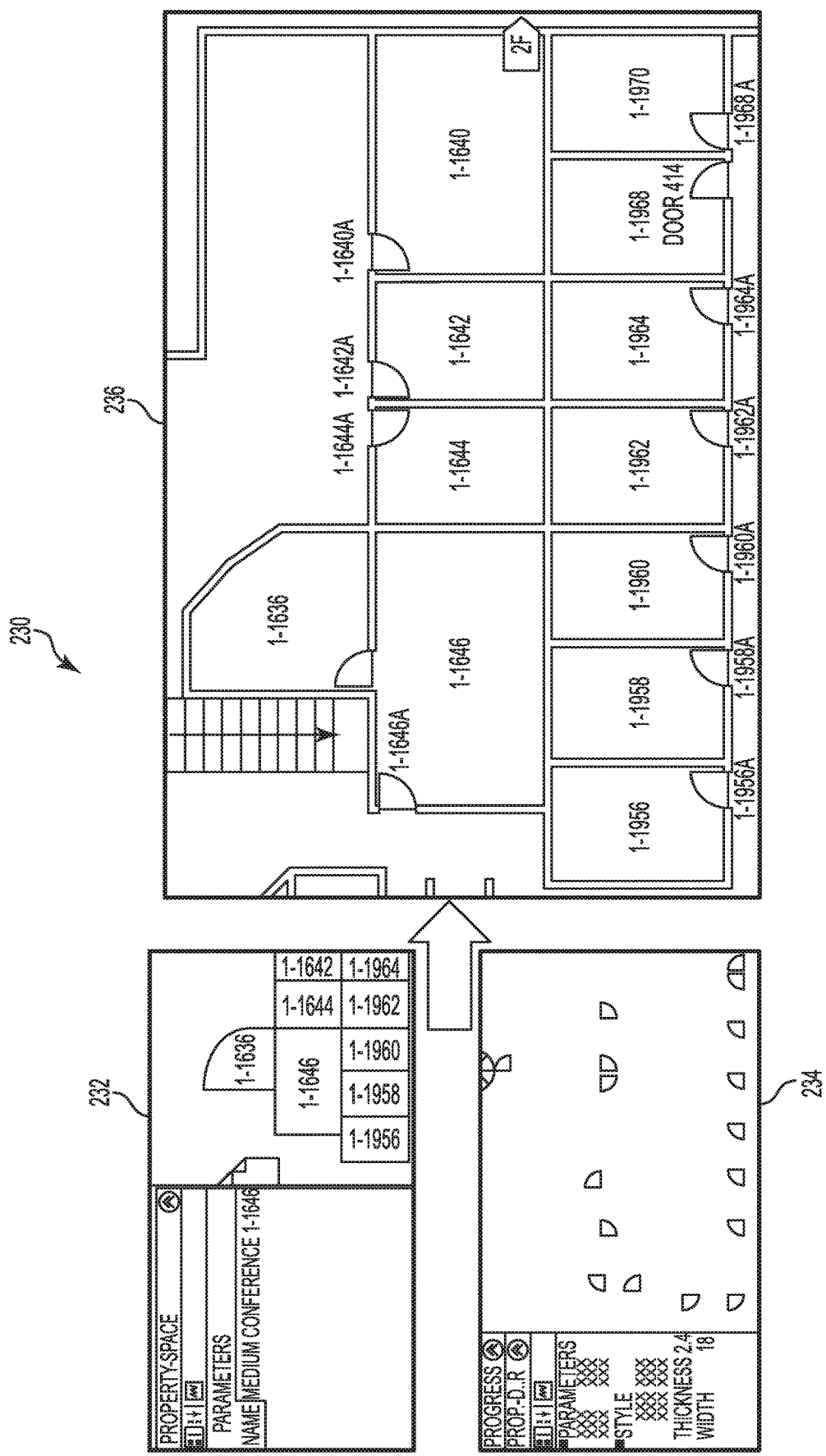
FIG. 2 is an example of a building model for building data consolidation according to one or more embodiments of the present disclosure.

FIG. 2 is an example of a building model 230 for building data consolidation according to one or more embodiments of the present disclosure. The building model 230 can be a visual representation of a portion of the method 100 as referenced in FIG. 1 for building data consolidation.

The building model 230 can include a visual representation of space tag data 232. The space tag data 232 can be extracted from a number of CAD drawings as described herein. The extracted space tag data 232 can be merged into a BIM model and be displayed on a computing device as described herein. The extracted space tag data 232 can include information relating to room names, room numbers, and/or other identification information of spaces within a building. The displayed space tag data 232 can display the spaces within the building and can include a number of names for the corresponding spaces.

The building model 230 can include a visual representation of door placement data 234. The door placement data 234 can be extracted from a number of CAD drawings representing the building as described herein. The extracted door placement data 234 can be merged into a BIM model as described herein. The extracted door placement data 234 can include location information for a plurality of doors within the building. In some embodiments, the extracted door placement data 234 can include information relating to each of the plurality of doors within the building. For example, the extracted door placement data 234 can include a type of door for each location within the building where a door is placed. The type of door can include a door model, a door size, and/or a door style, among other features of the door.

The building model 230 can include merging the space tag data 232 and the door placement data 234 into a combined floor plan 236. The combined floor plan 236 can include the space tag data 232 and the door placement data 234. The combined floor plan 236 can be a BIM model that can be displayed on a computing device.

As described herein, extracting a particular layer of objects and/or extracting a particular object type from a particular layer can reduce a quantity of noise that can be generated via the extraction process. In addition, the extracted data can be displayed for a single object and/or a single layer to display only the objects and/or layers that are extracted to create displayed data that is easier to recognize noise compared to previous methods. That is, the displayed extracted data can be in a BIM model format that enables a user to identify noise for each layer without having to view other objects and/or layers in the same display.

Figure 3:
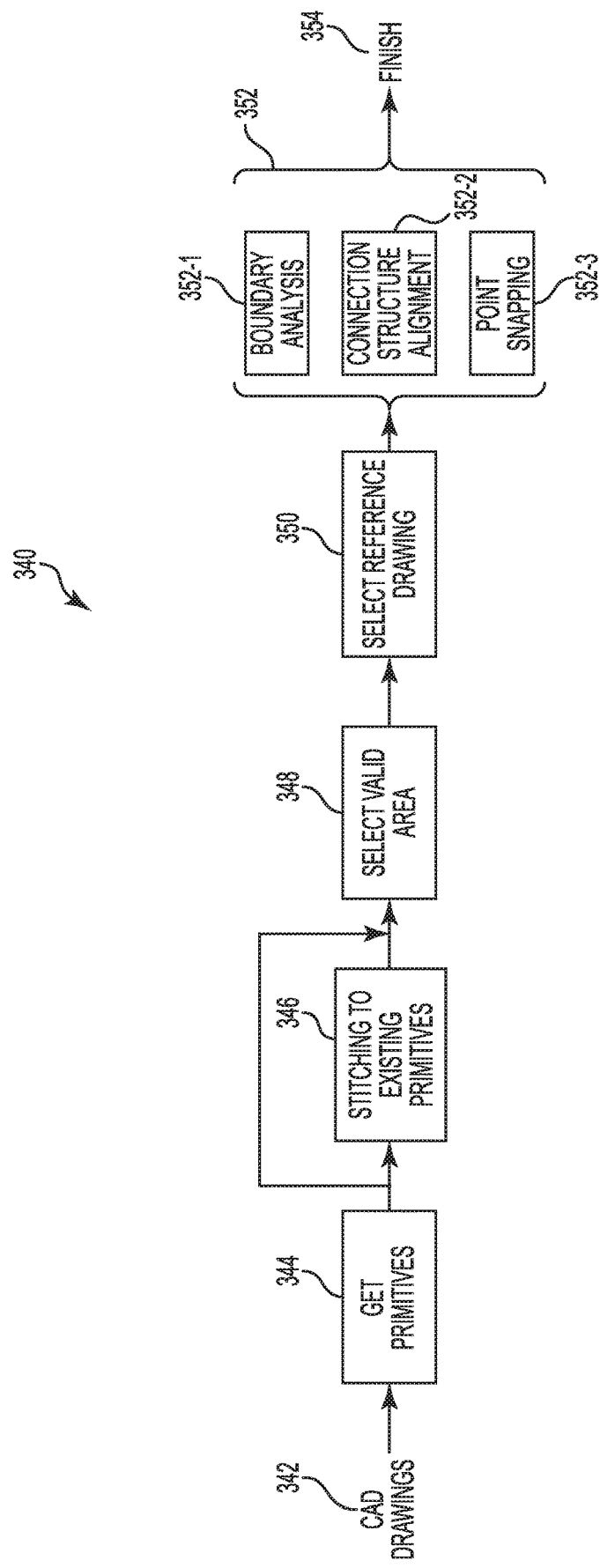
FIG. 3 is an example of a method for building data consolidation according to one or more embodiments of the present disclosure.

FIG. 3 is an example of a method 340 for building data consolidation according to one or more embodiments of the present disclosure. The method 340 can be utilized to extract data from a number of CAD drawings 342 that are representative of a building, stitch and align the extracted data, and utilize the extracted data and/or primitives of the CAD drawings 342 to create a BIM model of the building. The CAD drawings 342 can include floor plan data relating to multiple floors of the building. The CAD drawings 342 can also include MEP data for multiple floors of the building. The CAD drawings 342 can be comprised of geometry primitives or grouped geometry primitives that can include a set of mixed basic primitives (e.g., lines, polygons, etc.).

A number of primitives 344 can be extracted and generated from the CAD drawings. The primitives 344 can include a relatively "rough" geometric primitive of a particular area that is represented by the CAD drawings. The primitives 344 can utilize: lines, polygons, polylines, rectangles, circles, ellipses, splines, arcs, text, and/or other shapes and symbols to represent various objects within the building. Each of the number of primitives 344 can represent a particular room and/or a particular area of the building. In some embodiments, the number of primitives 344 can be extracted from the CAD drawings 342 all at once. That is, all the information from the CAD drawings 342 can be extracted to generate the primitives 344.

In some embodiments, the primitives 344 are divided into a plurality of primitives 344 that each represent a particular area of the building. For example, there can be a first primitive 344 that represents a kitchen within the building and a second primitive 344 that represents an office within the building. In order to generate a complete BIM model of the building, the number of primitives 344 can be stitched together. The primitives 344 can be divided based on a number of zones on a single story of the building and/or the primitives 344 can be divided based on a plurality of different stories (e.g., levels of a building).

Stitching the number of primitives 344 together can include placing all of the primitives in a single story of the building. A first primitive of the number of primitives 344 can be selected and a second primitive can be selected for stitching the first primitive and the second primitive together. In some embodiments, there can be "overlap" between the first primitive and the second primitive. Overlap can include a portion of the first primitive that is also included in the second primitive. For example, a staircase may be on an edge of the first primitive and the same staircase may also be included on a corresponding edge of the second primitive. In this example, there may be only one staircase and therefore the staircase of the first and second primitive would be considered overlap and the area may have to be edited to fix the overlap and/or positioned so the overlap aligns before stitching the first primitive to the second primitive.

There can be overlap details that includes a number of gridlines that are displayed with the number of primitives 344. In some embodiments, the gridlines can be imbedded in each of the number of primitives 344. The embedded gridlines can be utilized to correctly position each of the number of primitives 344 prior to stitching the number of primitives 344 together. In some embodiments, the gridlines can include an embedded mark on the number of primitives. The embedded mark can be unique to a first primitive 344 and have a corresponding embedded mark on a second primitive 344. The embedded mark on the first primitive 344 can be aligned with the embedded mark on the second primitive 344 to place the first primitive 344 and the second primitive 344 in a position for stitching that accounts for the overlap between the first primitive 344 and the second primitive 344.

Stitching the number of primitives 344 together can include stitching the extracted number of primitives 344 with a number of existing primitives 346. The number of existing primitives 346 can include primitives that were generated from a different source and/or generated earlier. Stitching to existing primitives 346 can be skipped if there are no existing primitives 346. This can be performed by the same and/or similar method as described herein.

Stitching the number of primitives 344 together can include binding a plurality of primitive images into a single primitive image by determining boundaries of the plurality of primitive images and aligning corresponding boundaries of the images before stitching them together. In some embodiments, there can be multiple levels of a building that can be stitched to other levels of the building. For example, the building can include three levels (e.g., a ground level, a first level, and a second level) that can each be stitched together to give a single representation of the building.

Stitching the number of primitives together can include selecting a valid area 348. Selecting a valid area 348 includes a selected area that can include a number of building elements in the drawing. For example, the valid area 348 can include floors, walls, doors, and/or stairs. In some embodiments, the valid area 348 may not include a legend or other description tables in the drawing. Selecting the valid area 348 can include removing noise (e.g., objects that are not wanted, objects that do not exist, objects that belong on a different story, primitives that belong on a different story, etc.) within the valid area 348 of the drawing. For example, all of the primitives can be extracted and presented together on a representation of a first story. In this example, the noise can include primitives that are not located on the first story. That is, primitives that are on a different story (e.g., second story) may need to be removed as noise when aligning the primitives for the first story.

When the valid area 348 is selected a reference drawing 350 can be selected. The reference drawing 350 can be a drawing of a lower story of the building. The reference drawing 350 can be utilized to align a story that is above the reference drawing 350 by aligning features that extend from the lower story to the story above the lower story. The features can include stair cases that extend from the lower story to the story above the lower story, an elevator that extends from the lower story to the story above the lower story, and/or walls that extend from the lower story to the story above the lower story. The features can be aligned to ensure that the lower layer and the story above the lower story are in the correction position for stitching the lower layer and the story above the lower story together.

The reference drawing 350 can also be a floor plan drawing of a first floor. The floor plan drawing of the first floor can be a reference drawing 350 for an MEP drawing for the first floor. That is, a floor plan drawing can be utilized as a reference drawing 350 for stitching a MEP drawing to the floor plan drawing.

When the reference drawing 350 is selected a number of alignment strategies 352 can be utilized to align and stitch the number of primitives 344 together. The number of alignment strategies 352 can allow for moving (e.g., shifting the number of primitives from left to right and/or up and down relative to a user interface), rotating (e.g., rotating the number of primitives by 45°, 90°, etc.), and/or scaling (e.g., increasing a size of the primitives, decreasing a size of the primitives) the number of primitives 344. The alignment strategies 352 can each be described in a single coordinate system comprising a number of gridlines as described herein.

The number of alignment strategies 352 can include matching a number of features from a lower story to a number of features from a higher story and/or a story above the lower story. In some embodiments, a threshold number of features are utilized as feature points when aligning the number of primitives 344. For example, three features can be utilized in a first primitive 344 to correspond to three features from a second primitive 344 when aligning the first primitive 344 and the second primitive 344.

A transfer matrix can be utilized to translate the number of primitives 344 to a particular coordinate system. That is, the transfer matrix can include a calculation for translating each of the number of primitives 344 into the particular coordinate system at a particular position based on an embedded mark and/or a feature point within each of the number of primitives 344. The embedded mark can be an identification mark that is embedded in the number of primitives to identify a position that recognizes and compensates for overlap between the number of primitives 344. The feature point can include identified structural features such as boundaries, walls, stairs, elevators, etc. The feature point within each of the number of primitives 344 can include particular structural features within a first number of primitives 344 that can correspond to structural features within a second number of primitives 344.

The alignment strategies 352 can include a boundary analysis 352-1 to identify feature points within each of the number of primitives 344. The boundary analysis 352-1 can determine the exterior walls of the building within each of the number of primitives 344. The boundary analysis 352-1 can include calculating a polygon representation of the exterior of the number of primitives 344. The polygon representation of the exterior can be utilized as an input for each story of the building and can be utilized to position each story of the building. A number of corner points can be identified from the polygon representation and an embedded mark can be placed at each of the number of corner points of the primitives 344. The embedded marks can be utilized as described herein.

The alignment strategies 352 can include a connection structure alignment 352-2. The connection structures can include features such as stairs and elevators that can connect a first story of the building to a second story of the building. As described herein, the connection structures can be identified and utilized to align a first story of the building with a second story of the building. For example, the connection structure such as a staircase of a first story can be used to align a second story that is adjacent to the first story based on the staircase that connects the first story to the second story. In some embodiments, a mark can be embedded on the staircase of the first story with a corresponding mark embedded on the staircase of the second story.

The alignment strategies 352 can include point snapping 352-3. Point snapping 352-3 can include defining a point that can be selected when a user selects a location that includes a number of feature points (e.g., endpoints of lines, corner of polygons, etc.) and/or embedded marks within the primitives 344. The point snapping 352-3 can include identifying and altering a user when the number of feature points and/or embedded marks are within a predetermined area of the defined point. That is, a user can move a first primitive 344 towards a second primitive 344 and when a feature point from the first primitive 344 comes relatively close to a feature point from the second primitive 344 the user can be alerted that the feature point from the first primitive 344 and the feature point from the second primitive 344 are in close proximity. In some embodiments, the first primitive 344 and the second primitive 344 can be "snapped" into the correct position (e.g., position that accounts for overlap) when the feature points are in relatively close proximity.

When the number of primitives 344 are aligned with in a correct position the number of primitives can be stitched together to generate a single primitive 344 representation of the building. The single primitive 344 representation of the building can be exported 354 to a computing device.

Figure 4:
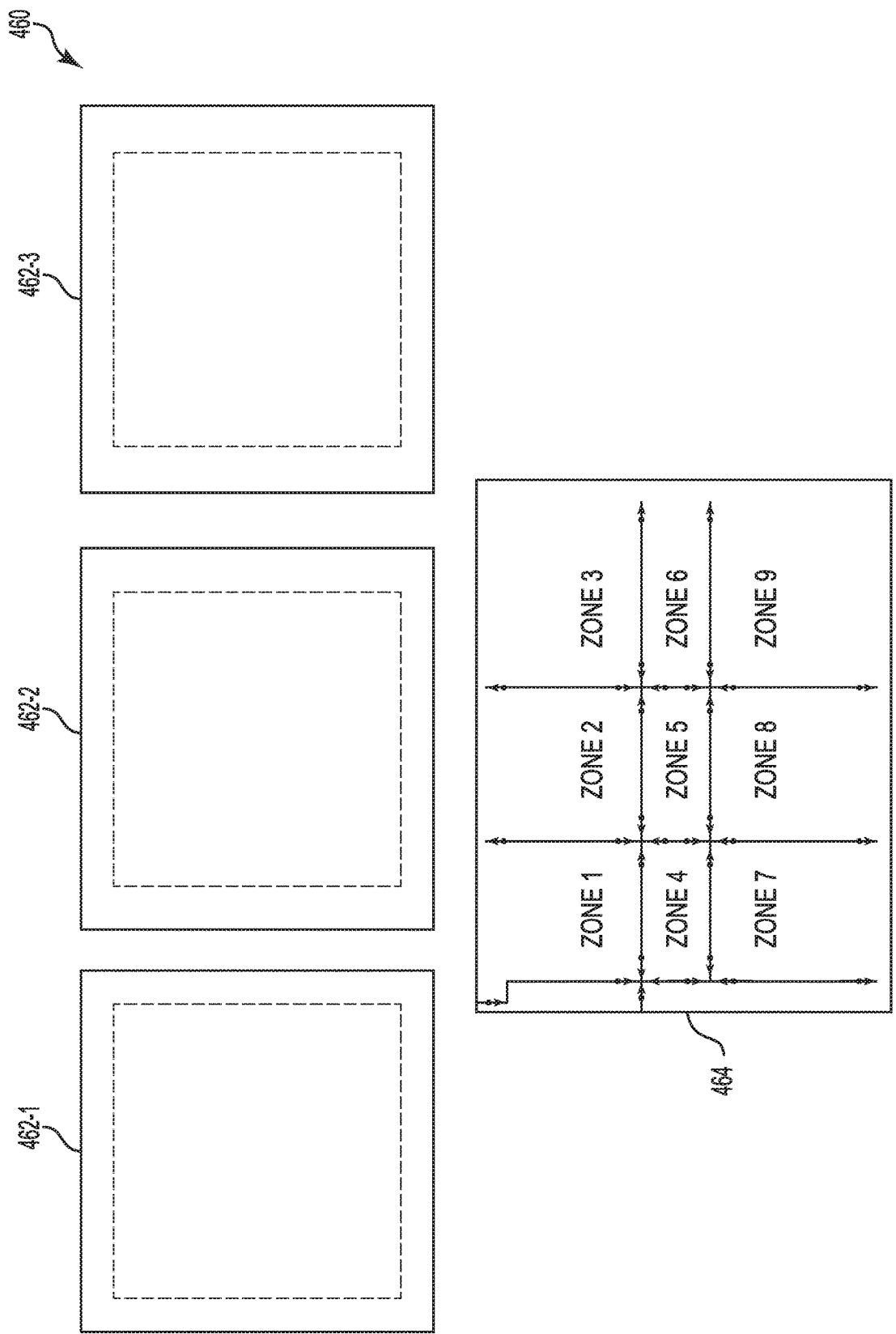
FIG. 4 is an example of a building model for building data consolidation according to one or more embodiments of the present disclosure.

FIG. 4 is an example of a building model 460 for building data consolidation according to one or more embodiments of the present disclosure. The building model 460 can be a visual depiction of the method 340 as described in reference to FIG. 3.

The building model 460 includes three visual representations of primitives 462-1, 462-2, 462-3 that each correspond to particular areas (e.g., zones) of a building. As described herein, a number of feature points and/or embedded marks can be utilized to identify a corresponding zone for each of the visual representations of primitives 462-1, 462-2, 462-3.

Each of the visual representations of primitives 462-1, 462-2, 462-3 can be translated to the zones drawing grid 464. As described herein, gridlines on the zones drawing grid 464 can include information relating to overlap between each of the zones. The information relating to the overlap between each of the zones can be utilized to translate each of the visual representations of primitives 462-1, 462-2, 462-3 at a corresponding zone. For example, the visual representation of primitive 462-1 can be translated to zone 1 of the zones drawing grid 464 and the overlap information can be utilized to translate the visual representation of primitive 462-2 to zone 2 of the zones drawing grid 464 in a correct position relating to the boundary of the zones drawing grid 464 and in a correct position in relation to primitive 462-1. In addition, the overlap information can be utilized to translate the visual representation of primitive 462-3 to zone 9 of the zones drawing grid 464. The overlap information can be utilized to correctly position the visual representation of primitive 462-3 relatively to the visual representation of primitives 462-1 and 462-2 respectively.

The translated visual representation of primitives 462-1, 462-2, 462-3 to the zones drawing grid 464 can be stitched together to a stitched grid. The stitched grid can be a single visual representation of a particular story and/or particular stories of a building.

Figure 5:
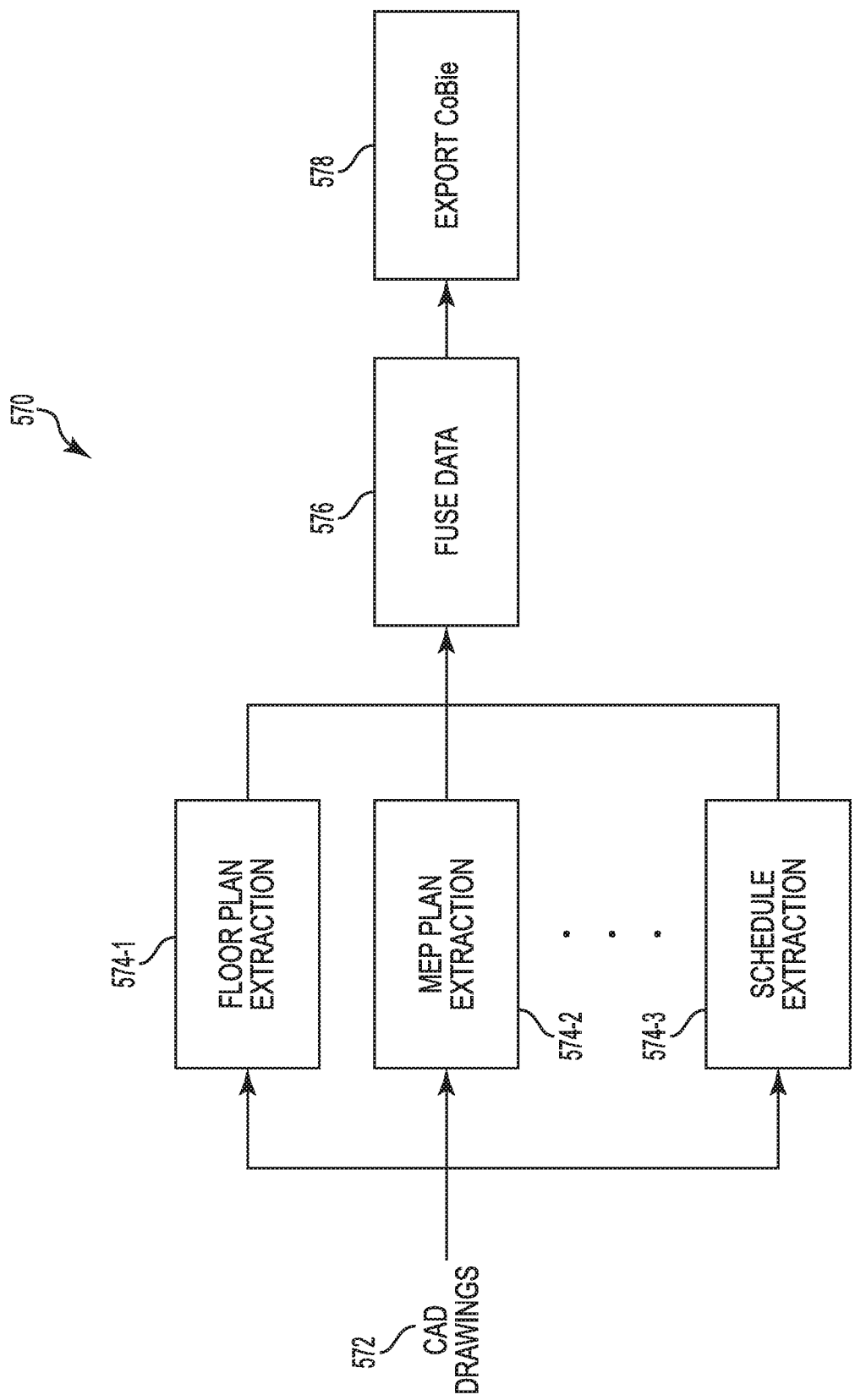
FIG. 5 is an example of a method for building data consolidation according to one or more embodiments of the present disclosure.

FIG. 5 is an example of a method 570 for building data consolidation according to one or more embodiments of the present disclosure. The method 570 relates to extracting construction operations building information exchange (CoBie) data from CAD drawings 572. The CoBie data from the CAD drawings 572 can include, but is not limited to: floor plan data from CAD drawings 572 relating to the floor plan of a building, HVAC data from MEP plan drawings/CAD drawings 572, and/or equipment parameter tables from a schedule drawing/CAD drawing 572.

The method 570 can include floor plan extraction 574-1 from floor plan drawings of the CAD drawings 572. The floor plan extraction 574-1 can include extracting information relating to the floor plan of a building. For example, floor plan extraction 574-1 can include extracting information including, but not limited to: space data, door data, stairs data, and/or elevator data, among other information relating to the floor plan depicted in the CAD drawings 572.

The method 570 can include MEP extraction 574-2 from an MEP plan drawing and/or CAD drawings 572. The MEP extraction 574-2 can include extracting information relating to the HVAC system of the building. For example, MEP extraction 574-2 can include extracting information including, but not limited to: diffuser data, VAV data, air handling unit (AHU) data, HVAC ductwork data, and/or supply data, among other information relating to the MEP information depicted in the MEP plan drawing and/or CAD drawings 572.

The method 570 can include schedule extraction 574-3 from the schedule plan and/or CAD drawings 572. Schedule extraction 574-3 can include extracting information relating to equipment parameters of systems that are operating in the building. For example, schedule extraction 574-3 can include extracting equipment parameters from a schedule drawing and/or CAD drawings 572. The schedule drawing can include information and/or real time data that corresponds to equipment (e.g., HVAC equipment, plumbing equipment, electrical equipment, etc.) within the building. For example, the schedule drawing can include, but is not limited to: equipment numbers, inlet size of equipment, CFM levels, among other information relating to the MEP system of the building.

The method 570 can include fusing extracted data 576 from the CAD drawings 572. Fusing extracted data 576 can include fusing the extracted data 576 in a CoBie template. In addition, fusing extracted data 576 can include calculating information that is requested by the CoBie format. That is, fusing the extracted data can include calculating information that is going to be translated into the CoBie table. The information that is requested can be filled into a CoBie table (e.g., CoBie excel spreadsheet, etc.). The CoBie table can then be exported at 578.

The method 570 can be a more accurate and more quickly data extraction from the CAD drawings 572 compared to previous methods. The method 570 can be utilized to convert table data from the CAD drawings 572 into an excel or other table format automatically. Automatically converting the data from the CAD drawings 572 can reduce human error when inputting the data from the CAD drawings 572 to the CoBie table.

Figure 6:
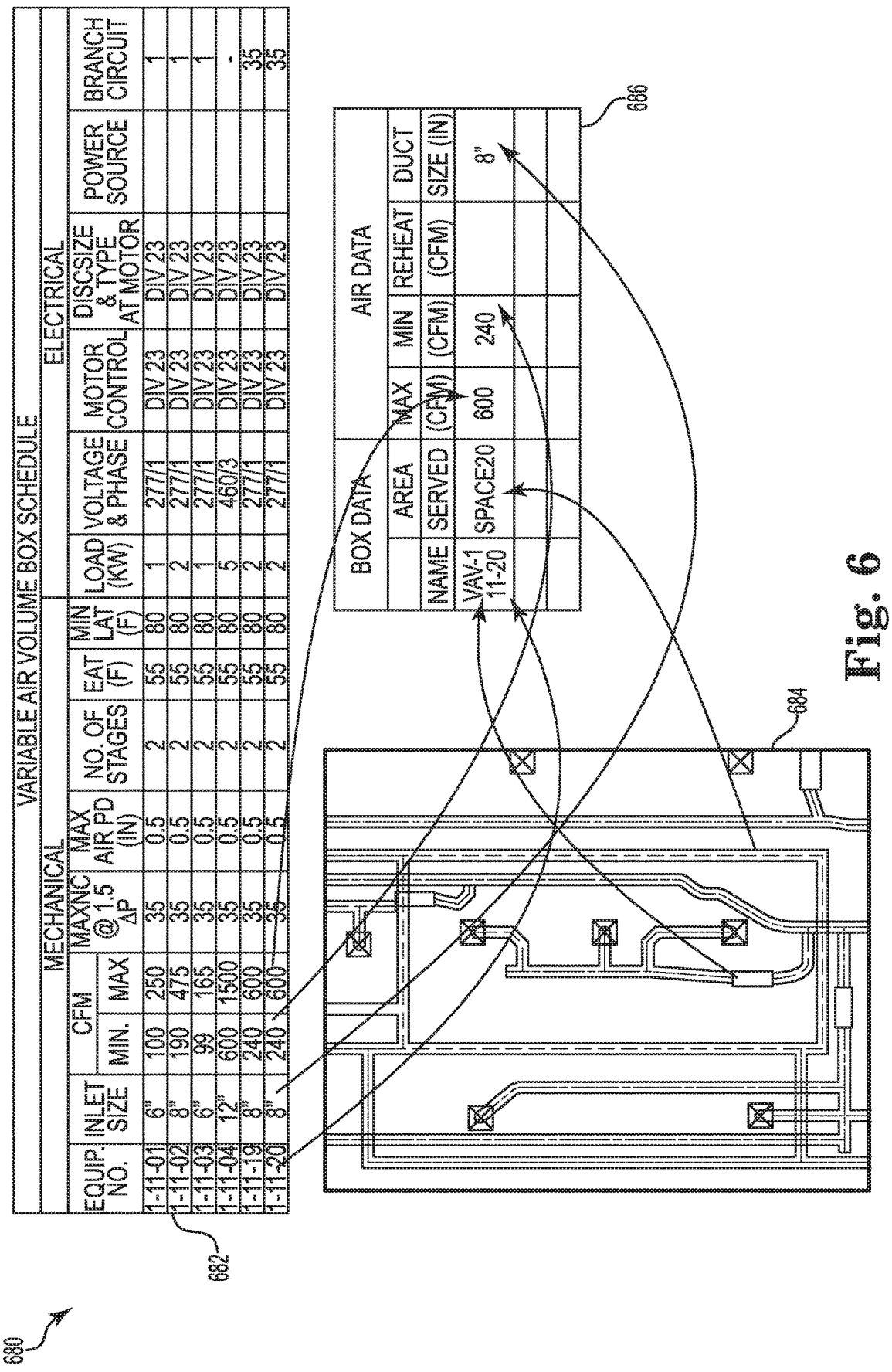
FIG. 6 is an example of a building model for building data consolidation according to one or more embodiments of the present disclosure.

FIG. 6 is an example of a building model 680 for building data consolidation according to one or more embodiments of the present disclosure. The building model 680 can include a number of scheduling tables 682 that correspond to a building. The scheduling tables 682 can include information and/or real time data that corresponds to equipment within the building. For example, the scheduling tables 682 can include, but are not limited to: equipment numbers, inlet size of equipment, CFM levels, among other information relating to the MEP system of the building.

The building model 680 can also include a CAD drawing 684. The CAD drawing 684 can include a visual representation of a number of areas of the building. The CAD drawing 684 can include floor plan information and/or MEP information as described herein.

The floor plan information and/or MEP information can be extracted from the CAD drawing 684 and imported to a CoBie table 686. For example, an equipment name can be extracted from the CAD drawing 684 and imported to a corresponding name box within the CoBie table 686. In another example, a space name from a space that includes the equipment can be extracted into an area served box within the CoBie table 686.

The information within the scheduling tables 682 can be extracted and imported into the CoBie table 686. The information within the scheduling tables 682 can be extracted and imported to corresponding information for information extracted from the CAD drawing 684. For example, the equipment number from the scheduling tables 682 can be extracted and imported to the name box of the corresponding name of the equipment that was extracted from the CAD drawings 684. In addition, a max and min CFM rate can be extracted from the scheduling tables 682 and imported to a corresponding min and max CFM rate within the CoBie table 686. The building model 680 can be an automated process of extracting information from multiple sources (e.g., CAD drawings 684, scheduling tables 682, etc.) into a CoBie table 686. The building model 680 can remove human error from data extraction and data implementation compared to previous methods.

Figure 7:
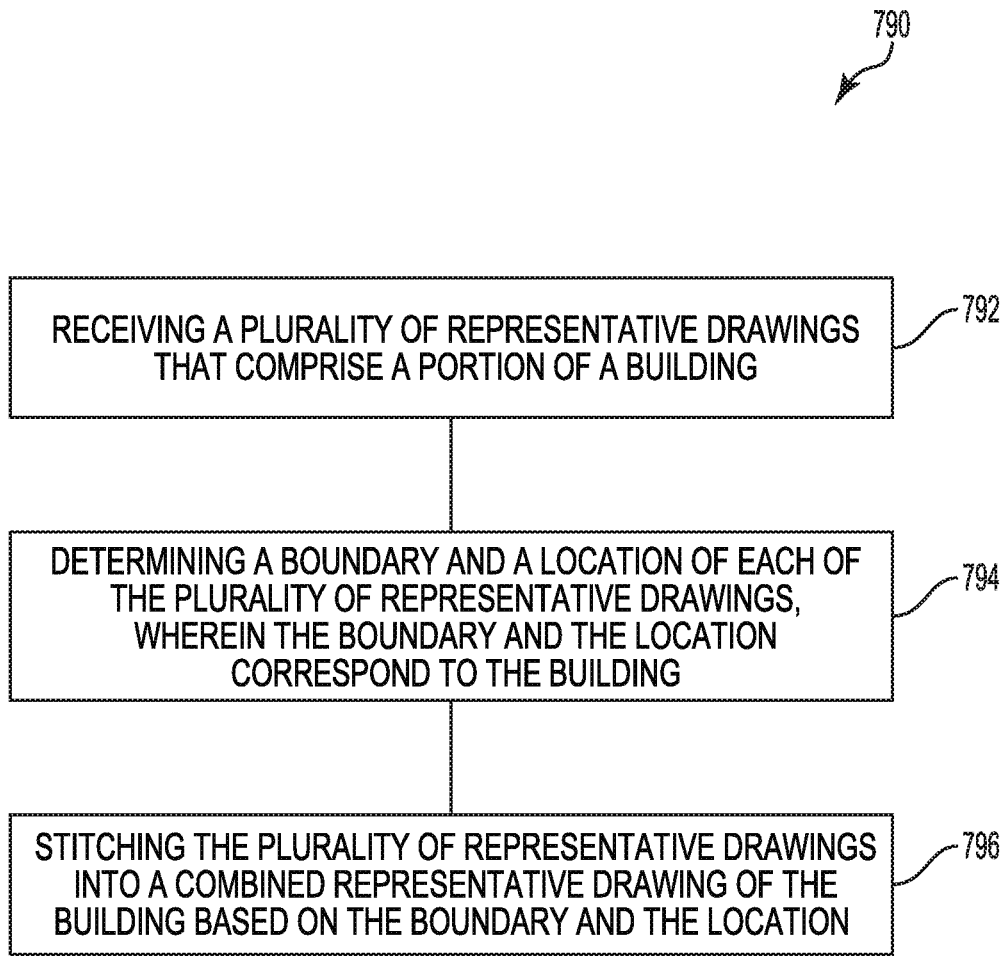
FIG. 7 is an example of a method for building data consolidation according to one or more embodiments of the present disclosure.

FIG. 7 is an example of a method 790 for building data consolidation according to one or more embodiments of the present disclosure. The method 790 can be utilized to consolidate data and/or visual representations that are extracted from a number of representative drawings (e.g., CAD drawings).

At box 792 the method 790 can include receiving a plurality of representative drawings that comprise a portion of a building. Receiving the plurality of representative drawings can include receiving and/or obtaining a number of CAD drawings of the building. As described herein, each of the number of CAD drawings can each represent only a portion of the building, such as particular room, a particular story of the building, and/or a different portion of the building.

At box 794, the method 790 can include determining a boundary and a location of each of the plurality of representative drawings, wherein the boundary and the location correspond to the building. As described herein, determining a boundary and location of each of the plurality of representative drawings can include determining a polygon boundary of the building and/or overlap data between each of the number of representative drawings. The boundary and the location of the number of representative drawings can be utilized in aligning each of the number of representative drawings as described herein. Determining the boundary and location can include embedding a mark or locating a number of feature points between the representative drawings.

At box 796, the method 790 can include stitching the plurality of representative drawings into a combined representative drawing of the building based on the boundary and the location. Stitching the plurality of representative drawings can include binding the representative drawings at intersection points. Stitching the plurality of representative drawings can include embedding a number of marks and/or identifying a number of corresponding features for each of the plurality of representative drawings to indicate proper alignment of each of the plurality of representative drawings.

The method 790 can provide for data extraction of multiple CAD drawings into a single CAD drawing and/or BIM model as described herein. The method 790 can include utilizing the extracted data to generate a CoBie table. That is, the method 790 can include extracting data from representative drawings and utilizing the extracted data to generate a single representation of a building and a corresponding CoBie table for the building. The method 790 can eliminate human error and extraction errors that can occur with previous methods of building data consolidation.

Figure 8:
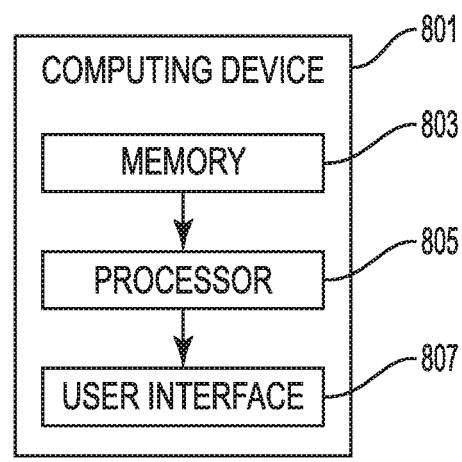
FIG. 8 is an example of a diagram of a device for building data consolidation according to one or more embodiments of the present disclosure.

FIG. 8 is an example of a diagram of a device 801 for building data consolidation according to one or more embodiments of the present disclosure. Computing device 801 can be, for example, a laptop computer, a desktop computer, or a mobile device (e.g., a mobile phone, a personal digital assistant, etc.), among other types of computing devices.

As shown in FIG. 8, computing device 801 includes a memory 803 and a processor 805 coupled to memory 803. Memory 803 can be any type of storage medium that can be accessed by processor 805 to perform various examples of the present disclosure. For example, memory 803 can be a non-transitory computer readable medium having computer readable instructions (e.g., computer program instructions) stored thereon that are executable by processor 805 to determine a deployment of an access control system in accordance with one or more embodiments of the present disclosure.

Memory 803 can be volatile or nonvolatile memory. Memory 803 can also be removable (e.g., portable) memory, or non-removable (e.g., internal) memory. For example, memory 803 can be random access memory (RAM) (e.g., dynamic random access memory (DRAM) and/or phase change random access memory (PCRAM)), read-only memory (ROM) (e.g., electrically erasable programmable read-only memory (EEPROM) and/or compact-disc read-only memory (CD-ROM)), flash memory, a laser disc, a digital versatile disc (DVD) or other optical disk storage, and/or a magnetic medium such as magnetic cassettes, tapes, or disks, among other types of memory.

Further, although memory 803 is illustrated as being located in computing device 801, embodiments of the present disclosure are not so limited. For example, memory 803 can also be located internal to another computing resource (e.g., enabling computer readable instructions to be downloaded over the Internet or another wired or wireless connection).

As shown in FIG. 8, computing device 801 can also include a user interface 807. User interface 807 can include, for example, a display (e.g., a screen). The display can be, for instance, a touch-screen (e.g., the display can include touch-screen capabilities). User interface 807 (e.g., the display of user interface 807) can provide (e.g., display and/or present) information to a user of computing device 801.

Additionally, computing device 801 can receive information from the user of computing device 801 through an interaction with the user via user interface 807. For example, computing device 801 (e.g., the display of user interface 807) can receive input from the user via user interface 807. The user can enter the input into computing device 801 using, for instance, a mouse and/or keyboard associated with computing device 801, or by touching the display of user interface 807 in embodiments in which the display includes touch-screen capabilities (e.g., embodiments in which the display is a touch screen).

As used herein, "logic" is an alternative or additional processing resource to execute the actions and/or functions, etc., described herein, which includes hardware (e.g., various forms of transistor logic, application specific integrated circuits (ASICs), etc.), as opposed to computer executable instructions (e.g., software, firmware, etc.) stored in memory and executable by a processor.

Although specific embodiments have been illustrated and described herein, those of ordinary skill in the art will appreciate that any arrangement calculated to achieve the same techniques can be substituted for the specific embodiments shown. This disclosure is intended to cover any and all adaptations or variations of various embodiments of the disclosure.

It is to be understood that the above description has been made in an illustrative fashion, and not a restrictive one. Combination of the above embodiments, and other embodiments not specifically described herein will be apparent to those of skill in the art upon reviewing the above description.

The scope of the various embodiments of the disclosure includes any other applications in which the above structures and methods are used. Therefore, the scope of various embodiments of the disclosure should be determined with reference to the appended claims, along with the full range of equivalents to which such claims are entitled.

In the foregoing Detailed Description, various features are grouped together in example embodiments illustrated in the figures for the purpose of streamlining the disclosure. This method of disclosure is not to be interpreted as reflecting an intention that the embodiments of the disclosure require more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed:

1. A computer-aided method for consolidating building data into a Building Information Model (BIM), comprising:
   receiving a plurality of representative drawings that comprise a portion of a building, the plurality of representative drawings including Computer-Aided Design (CAD) drawings;
   extracting a number of layers from the CAD drawings, one of the extracted layers including a Heating Ventilating and Air Conditioning (HVAC) related layer;
   extracting CAD data from the CAD drawings;
   extracting equipment parameters from the CAD drawings;
   fusing the extracted CAD data and the extracted equipment parameters from the CAD drawings into a Construction Operations Building Information Exchange (COBIE) table for at least the portion of the building;
   assigning the extracted number of layers into a number of categories; and
   merging the categories together to form the BIM model to correspond with the COBIE table.

2. The computer-aided method of claim 1, wherein one of the number of categories comprises a floor plan category.

3. The computer-aided method of claim 1, wherein one of the number of layers comprises one of a door layer, a wall layer, a room tag layer or a stair layer.

4. The computer-aided method of claim 1, wherein one of the number of layers comprises one of a diffuser layer, a Variable Air Volume (VAV) layer or a ductwork layer.

5. The computer-aided method of claim 1, wherein the extracted number of layers correspond to a single floor of the building.

6. The computer-aided method of claim 1, wherein the extracted number of layers correspond to a plurality of different floors of the building.

7. The computer-aided method of claim 1, wherein extracting a number of layers from the CAD drawings comprises extracting a single layer type or a single object at a time.

8. A non-transitory computer readable medium, comprising instructions to:
   receive a plurality of representative drawings that comprise at least a portion of a building, the plurality of representative drawings including Computer-Aided Design (CAD) drawings;
   extract CAD data from the CAD drawings;
   extract equipment parameters from the CAD drawings;
   fuse the extracted CAD data and the extracted equipment parameters from the CAD drawings into a Construction Operations Building Information Exchange (COBIE) table for at least the portion of the building; and
   form a Building Information Model (BIM) that correspond with the COBIE table.

9. The non-transitory computer readable medium of claim 8, further comprises instructions to:
   extract a number of layers from the CAD drawings, one of the extracted layers including a Heating Ventilating and Air Conditioning (HVAC) related layer;
   categorize the extracted number of layers into a number of categories; and
   merge the categories together to form the Building Information Model (BIM) that correspond with the COBIE table.

10. The non-transitory computer readable medium of claim 8, wherein one of the number of layers comprises one of a door layer, a wall layer, a room tag layer or a stair layer.

11. The non-transitory computer readable medium of claim 8, wherein one of the number of layers comprises one of a diffuser layer, a Variable Air Volume (VAV) layer or a ductwork layer.

12. The non-transitory computer readable medium of claim 11, wherein extracting a number of layers from the Computer-Aided Drawing (CAD) drawings comprises extracting a single layer type or a single object at a time.

13. The non-transitory computer readable The medium of claim 8, further comprising instructions to identify a number of objects including: spaces, doors, stairs, and elevators.

14. The non-transitory computer readable medium of claim 13, wherein the number of objects includes Heating Ventilating and Air conditioning (HVAC) data including: diffuser data, Variable Air Volume (VAV) data, Air Handling Unit (AHU) data, and ductwork data.

15. A system for building a Building Information Model (BIM) for at least part of a building from a plurality of Computer-Aided Design (CAD) drawings, comprising:
   a computer memory; and
   a computer processor configured to execute executable instructions stored in the computer memory to:
      receive a plurality of CAD drawings that each comprise a portion of a building with a corresponding number of objects;
      extract a number of objects from each of the plurality of CAD drawings including object data and object parameters;
      determine a boundary of each of the plurality of CAD drawings;
      determine a location of the number of objects within the building;
      stitch the plurality of CAD drawings into a BIM representation of the building based on the boundary and the location of the number of extracted objects within the building; and
      associate extracted object data and extracted object parameters with the number of extracted objects, the number of extracted objects including Heating Ventilating and Air Conditioning (HVAC) objects; and creating a Construction Operations Building Information Exchange (COBIE) table for at least the portion of the building based at least in part on the extracted object data and the extracted object parameters.

16. The system of claim 15, wherein the object data from the extracted objects includes one or more of: a corresponding name, a corresponding object number, a corresponding serial number, and object usage data.

17. The system of claim 15, wherein the instructions to associate extracted object data and extracted object parameters includes instructions to bind the object data and object parameters to a corresponding object.

18. The system of claim 15, further comprising instructions to align a CAD drawing from the plurality of CAD drawings that represents a bottom floor of the building with at least one other CAD drawing from the plurality of CAD drawings.

19. The system of claim 15, wherein the number of extracted objects includes a particular layer of devices that interact to provide a system for the building.

* * * * *